US008288944B2

(12) United States Patent
Lee et al.

(10) Patent No.: US 8,288,944 B2

(45) Date of Patent: Oct. 16, 2012

(54) ORGANIC LIGHT-EMITTING DISPLAY APPARATUS SEALED WITH A SEALANT CONTAINING A FILLER

(75) Inventors: Jung-Min Lee, Yongin (KR); Tae-Wook Kang, Yongin (KR); Jang-Hwan Shin, Yongin (KR); Jin-Hwan Jeon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 51 days.

(21) Appl. No.: 12/962,877

(22) Filed: Dec. 8, 2010

(65) Prior Publication Data

US 2011/0140599 A1 Jun. 16, 2011

(30) Foreign Application Priority Data

Dec. 10, 2009 (KR) ........................ 10-2009-0122538

(51) Int. Cl.

*H01L 51/50* (2006.01)

*H05B 33/04* (2006.01)

(52) U.S. Cl. ........................................ 313/512; 313/504

(58) Field of Classification Search ........................ None

See application file for complete search history.

(56) References Cited

U.S. PATENT DOCUMENTS

2009/0044496 A1* 2/2009 Botelho et al. ................ 313/512

2009/0058292 A1* 3/2009 Koo et al. ...................... 313/512

2010/0270919 A1* 10/2010 Hubert et al. ................ 313/512

FOREIGN PATENT DOCUMENTS

JP 2005322432 11/2005

OTHER PUBLICATIONS

Machine translation of Applicant Cited JP2005-322432A published Nov. 17, 2005.*

Korean Office Action issued by KIPO, dated Feb. 8, 2011, corresponding to Korean Patent Application No. 10-2009-0122538, together with Request for Entry.

* cited by examiner

*Primary Examiner* — Anh Mai

*Assistant Examiner* — Britt D Hanley

(74) *Attorney, Agent, or Firm* — Robert E. Bushnell, Esq.

(57) ABSTRACT

An organic light-emitting display apparatus including: a substrate; a display unit disposed on the substrate; an encapsulation substrate disposed on the display unit; and a sealant by which the substrate is combined with the encapsulation substrate and which includes a filler, wherein a height of the sealant is greater than a height of the filler.

12 Claims, 5 Drawing Sheets

ORGANIC LIGHT-EMITTING DISPLAY APPARATUS SEALED WITH A SEALANT CONTAINING A FILLER

CROSS-REFERENCE TO RELATED APPLICATION

This application claims the benefit of Korean Patent Application No. 10-2009-0122538, filed on Dec. 10, 2009, in the Korean Intellectual Property Office, the disclosure of which is incorporated herein by reference.

BACKGROUND

1. Field

The present disclosure relates to organic light-emitting display apparatuses that are resistant to the permeation of external impurities, such as oxygen and/or water vapor, and have enhanced impact resistance.

2. Description of the Related Art

Currently, thin-film portable flat panel display apparatuses are increasing in popularity. Among flat panel display apparatuses, electroluminescent display apparatuses are regarded as the next-generation of display apparatus, because they are self-emissive, have a wide viewing angle, a high contrast ratio, and a short response time. In addition, organic light-emitting display apparatuses, which include an organic emission layer, have a higher brightness, a lower driving voltage, and a shorter response time than inorganic light-emitting display apparatuses.

FIG. 1 is a cross-sectional view of a conventional organic light-emitting display apparatus. Referring to FIG. 1, a display unit 20 is disposed on a substrate 10, and an encapsulation substrate 30 is disposed over the display unit 20. The substrate 10 is combined with the encapsulation substrate 30, using a sealant 41.

An organic light-emitting device included in a flat panel display apparatus may be degraded by various internal and external factors. Such internal factors include the deterioration of an emission layer, due to oxygen from the indium tin oxide (ITO) of an electrode, and deterioration caused by a reaction between an emission layer and adjacent layers. Such external factors include the permeation of external water vapor, oxygen, and ultra violet rays, and device manufacturing conditions. In particular, external water vapor and oxygen greatly affect the lifetime of an organic light-emitting device. Thus, the packaging of an organic light-emitting device is very important.

However, as illustrated in the conventional organic light-emitting display apparatus of FIG. 1, when the substrate 10 is combined with the encapsulation substrate 30 using the sealant 41, impurities such as external oxygen and/or water vapor permeate through the sealant 41, particularly, through an interface between the sealant 41 and the encapsulation substrate 30, thereby damaging the display unit 20. In addition, the sealant 41 may be easily broken by impacts.

SUMMARY

The present disclosure provides an organic light-emitting display apparatus that is resistant to the permeation of external impurities, such as oxygen and/or water vapor, and has enhanced impact resistance.

According to an aspect of the present invention, there is provided an organic light-emitting display apparatus including: a substrate; a display unit disposed on the substrate; an encapsulation substrate disposed over the display unit; and a sealant to attach the substrate to the encapsulation substrate. The sealant comprises a filler, and the height $t_{frit}$ of the sealant is greater than the height $d_{filler}$ of the filler.

According to various embodiments, a ratio of the height $d_{filler}$ of the filler to the height $t_{frit}$ of the sealant may be 0.75 or less.

According to various embodiments, the ratio of the height $t_{frit}$ of the sealant to the height $d_{filler}$ of the filler may be 0.5 or less.

According to various embodiments, the sealant may include a glass frit.

According to various embodiments, the filler may be disposed at the center of the sealant, equidistant from the substrate and the encapsulation substrate.

According to various embodiments, the filler may be cylindrical.

According to various embodiments, the sealant may be formed along edge portions of the encapsulation substrate.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION

Figure 1:
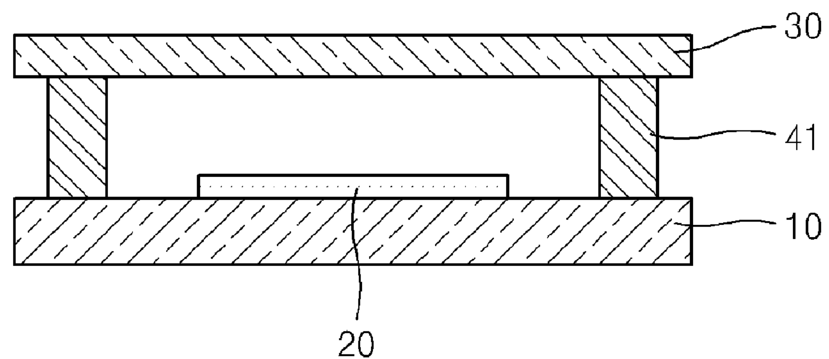
FIG. 1 is a cross-sectional view of a conventional organic light-emitting display apparatus.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed therebetween. When a first element is referred to as being formed or disposed "directly on" a second element, no other elements are disposed therebetween. In addition, when a first element is described as being "connected to" a second element, the first element may be directly connected to the second element, or may be indirectly connected to the second element, via one or more intervening elements.

Figure 2:
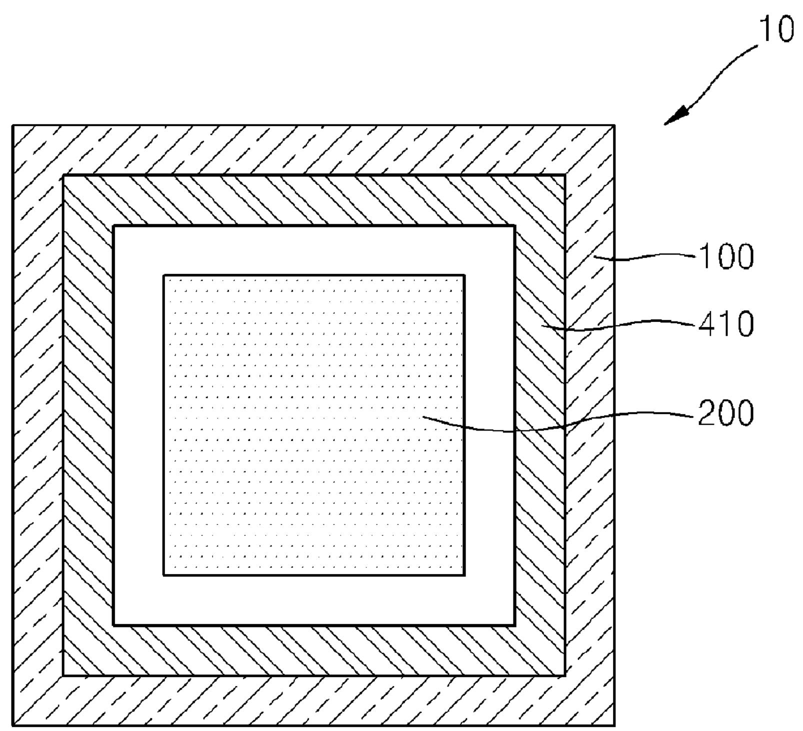
FIG. 2 is a schematic, partial plan view of an organic light-emitting display apparatus, according to an exemplary embodiment of the present invention.
Figure 3:
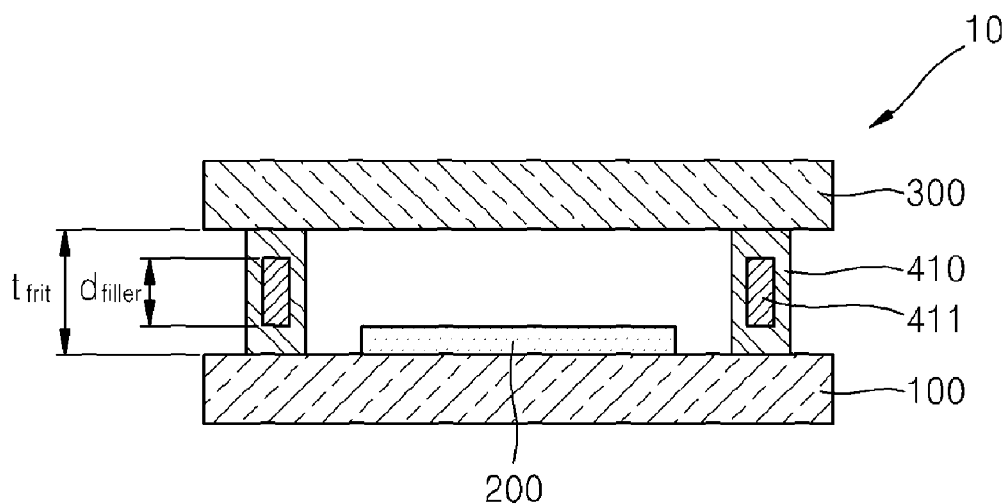
FIG. 3 is a schematic cross-sectional view of the organic light-emitting display apparatus of FIG. 2.

FIG. 2 is a schematic, partial plan view of an organic light-emitting display apparatus 10, according to an exemplary embodiment of the present invention, and FIG. 3 is a schematic cross-sectional view of the organic light-emitting display apparatus 10. Referring to FIGS. 2 and 3, an encapsulation substrate 300 included in the organic light-emitting display apparatus 10 of FIG. 3 is not shown in FIG. 2.

The apparatus 10 includes a display unit 200 disposed on a substrate 100. The substrate 100 may be formed of a transparent glass material including $SiO_2$ as a main ingredient. However the substrate 100 is not limited thereto. For example, the substrate 100 may also be formed of a transparent plastic material. The transparent plastic material for may be an insulating organic material such as polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose tri acetate (TAC), or cellulose acetate propionate (CAP).

If the organic light-emitting display apparatus 10 is a bottom emission organic light-emitting display apparatus, in which an image is displayed through the substrate 100, the substrate 100 may be formed of a transparent material. However, if the organic light-emitting display apparatus 10 is a top emission organic light-emitting display apparatus, in which an image is displayed in a direction opposite to the substrate 100, the substrate 100 need not be formed of a transparent material. In the latter case, the substrate 100 may be formed of a metal. When the substrate 100 is formed of a metal, the substrate 100 may include at least one metal selected from the group consisting of carbon, iron, chromium, manganese, nickel, titanium, molybdenum, stainless steel (SUS), Invar alloy, Inconel alloy, and Kovar alloy. However, the substrate 100 may also include other materials. For example, the substrate 100 may be a metal foil.

Although not illustrated, a buffer layer (not shown) may be further formed on the substrate 100. The buffer layer may planarize the substrate 100 and prevent permeation of impurities.

The substrate 100 is combined with the encapsulation substrate 300, such that the encapsulation substrate 300 is disposed over the display unit 200. The encapsulation substrate 300 may also be a glass substrate or a plastic substrate such as an acryl substrate. Furthermore, the encapsulation substrate 300 may be a metal substrate.

The substrate 100 is combined with the encapsulation substrate 300 using the sealant 410. The sealant 410 may surround the display unit 200. The sealant 410 may include a glass frit. A filler 411 is included in the sealant 410. The height $d_{filler}$ of the filler 411 may be in a predetermined fraction of the height $t_{frit}$ of the sealant 410. Herein, the heights $t_{frit}$ and $d_{filler}$ are taken in a direction perpendicular to the plane of the substrate 100.

In detail, the sealant 410 may be formed using a glass frit paste. The glass frit paste includes glass powder, the filler 411, and a liquid carrier. The glass powder is prepared by finely milling a glass that consists of four or more compounds. The glass powder is dry-milled, such that a particle diameter of the glass powder is within 20% of the height $t_{frit}$ of the sealant 410, after sintering. In general, the height $t_{frit}$ is in the range of about 3 to 30 μm. Thus, an average particle diameter of the glass powder may be in the range of about 0.6 to about 6 μm.

The substrate 100 and the encapsulation substrate 300 are generally formed of glass having a low coefficient of thermal expansion (CTE), so as to maintain a constant pattern before and after a thermal process. Accordingly, the glass powder used to prepare the glass frit paste should also have a CTE that is similar to those of the substrate 100 and the encapsulation substrate 300.

The substrate 100 is attached to the encapsulation substrate 300, by locally melting the sealant 410. Thus, the sealant 410 may be a sealant that melts at low temperature and then smoothly flows and forms a strong mechanical bond between the substrate 100 and the encapsulation substrate 300. A sealant having such features generally has a high CTE, and a very low impact resistance, due to having weak intermolecular bonds. That is, even when very small impacts are applied to the sealant, the sealant 410 is very likely to crack.

The filler 411 compensates for the low impact resistance and high CTE of the sealant 410. The filler 410 may be, for example, a ceramic that is added to the glass powder when the glass frit paste is prepared. The filler 411 may be any filler that has a lower CTE than that of the glass powder. For example, the filler 411 may have a negative CTE, so as to have good structural stability and a low CTE. The addition of the filler 411 to the glass powder may improve mechanical properties, such as the Young's modulus, fracture toughness, etc., of the sealant 410.

However, when the filler 411 is too large, the inclusion of the filler 411 in the sealant 410 may otherwise result in breakage of a display apparatus including the same, when the display apparatus is dropped. In particular, stress may be focused on the filler 411, although mechanical strength of the display apparatus may be improved.

In detail, the impact resistance of the organic light-emitting display apparatus 10 was evaluated as follows. A panel was inserted into a test jig and then dropped onto a stone surface, from a height of 1.5 m or more. As a result, among defective panels, about 80% cracked at an interface of the sealant 410 and the substrate 100, or at an interface of the sealant 410 and the encapsulation substrate 300. In such cases, the sealant 410 was completely broken and the substrate 100 and the encapsulation substrate 300 also cracked. In regard to the panels in which cracks occurred at the interface of the sealant 410 and the substrate 100, or at the interface of the sealant 410 and the encapsulation substrate 300, cracks mostly originated from the larger fillers 411. That is, when impacts are applied to a panel by dropping, stress focuses more on the filler 411, as the height of the filler 411 is increased. In addition, cracks occur at the interface of the sealant 410 and the substrate 100, or the interface of the sealant 410 and the encapsulation substrate 300.

To solve these and/or other problems, the height, location, and/or shape of filler 411 may be appropriately set. Thus, the organic light-emitting display apparatus 10 may have an enhanced impact resistance. The structure of the filler 411 in the organic light-emitting display apparatus 10 will now be described in further detail.

Figure 4A:
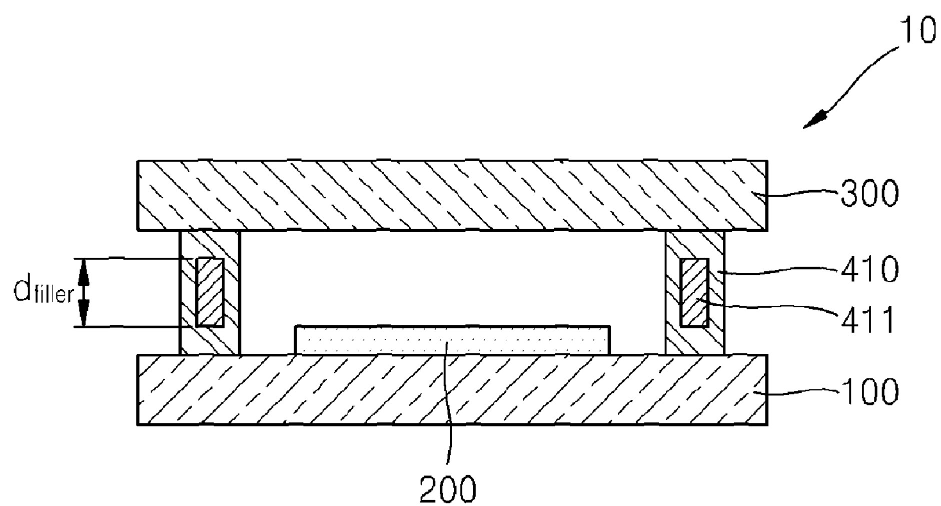
FIG. 4A illustrates a filler disposed at the center of a sealant.
Figure 4B:
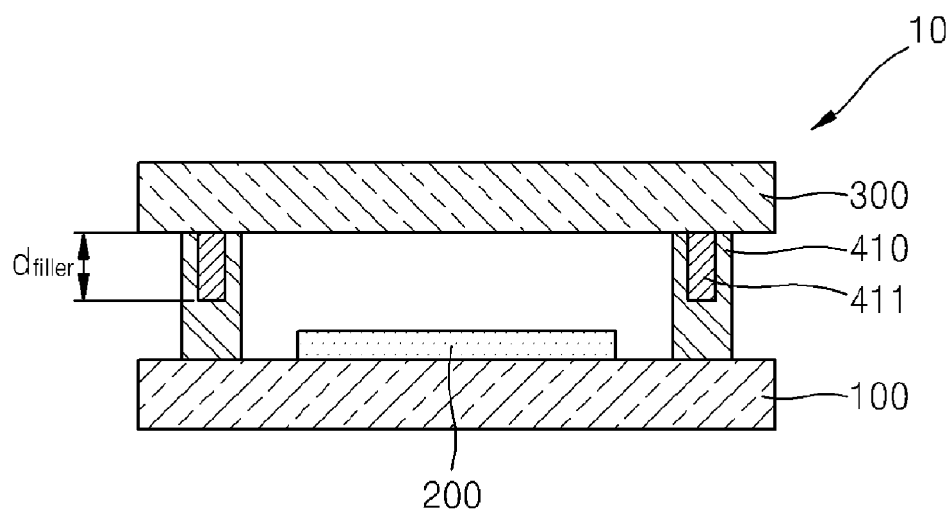
FIG. 4B illustrates a filler disposed near an encapsulation substrate.
Figure 4C:
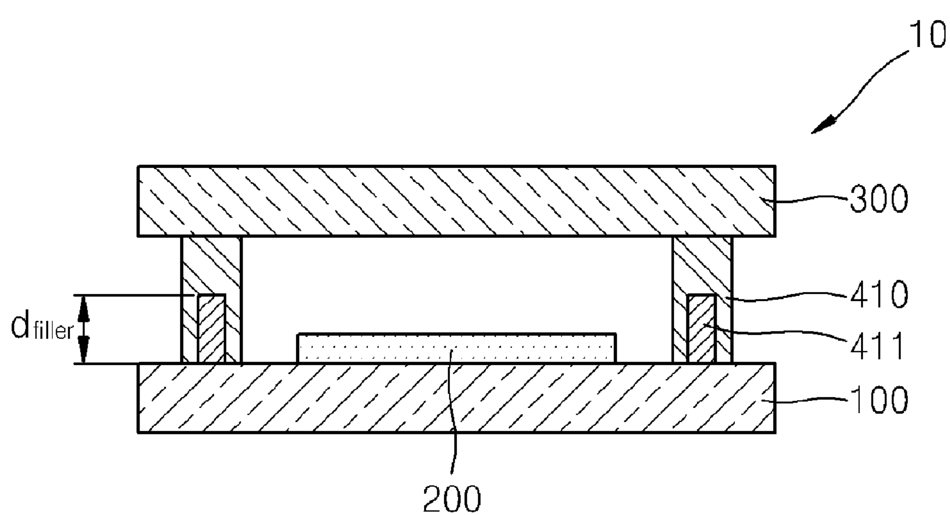
FIG. 4C illustrates a filler disposed near a substrate.
Figure 4D:
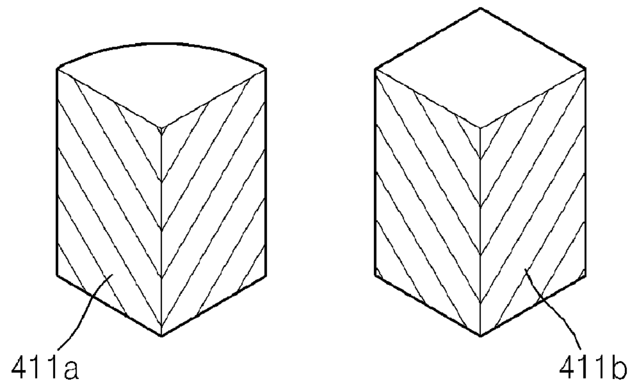
FIG. 4D illustrates portions of fillers having various shapes.

FIG. 4A illustrates the filler 411 disposed at the center of the sealant 410, according to an exemplary embodiment of the present invention. FIG. 4B illustrates the filler 411 disposed in a upper portion of the sealant 410, that is, near the encapsulation substrate 300, according to an exemplary embodiment of the present invention. FIG. 4C illustrates the filler 411 disposed in a lower portion of the sealant 410, that is, near the substrate 200, according to an embodiment of the present invention. FIG. 4D illustrates sectional views of corner portions of fillers 411*a* and 411*b*, which are disposed at corners of a display device. In particular, the filler 411*a* has rounded corner portions (curved edges), such that the filler 411*a* is partially cylindrical, i.e., forms a rectangle with rounded corners. The filler 411*b* has cubic corner portions, such that the filler 411*b* is rectangular.

Figure 5:
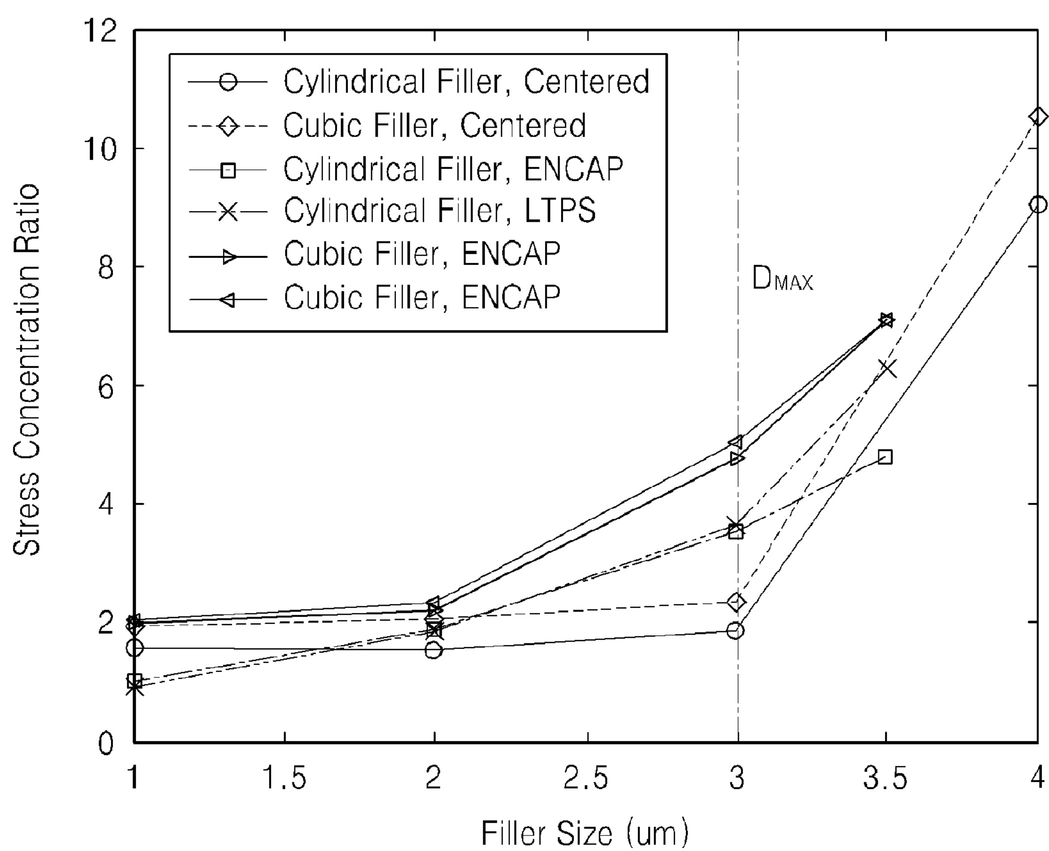
FIG. 5 is a graph showing drop-impact experiment results of six display apparatuses having fillers located as shown in FIGS. 4A, 4B, and FIG. 4C, and the having the shapes illustrated in FIG. 4D.

FIG. 5 is a graph showing the results of six drop-impact experiments, wherein the filler locations of FIGS. 4A, 4B, and FIG. 4C and the filler shapes illustrated in FIG. 4D were tested. Referring to the graph of FIG. 5, the x-axis represents the sizes (heights) of fillers, and the y-axis represents stress concentration ratios. In this regard, the height of the sealants is maintained at 4 μm.

Referring to FIG. 5, it can be seen that in all six cases, when the height of the filler is more than 3 μm, that is, a ratio of the height $d_{filler}$ of the filler to the height $t_{frit}$ of the sealant is greater than 0.75, the stress concentration ratio significantly increases, meaning that stress is focused on a filler. Thus, the filler is highly likely to crack. That is, only when the ratio of the height $d_{filler}$ of the filler to the height $t_{frit}$ of the sealant is 0.75 or less, the stress concentration ratio is reduced to a satisfactory level, and thus, the impact resistance of the organic light-emitting display apparatus 10 may be sufficiently enhanced.

In addition, it can also be seen that when the height of the filler 411 is 2 μm or less, or the ratio of the height $d_{filler}$ of the filler 411 to the height $t_{frit}$ of the sealant 410 is 0.5 or less, in all the six cases, the stress concentration ratio is 2 or less. That is, when the ratio of the height $d_{filler}$ to the height $t_{frit}$ is 0.5 or less, the impact resistance of the organic light-emitting display apparatus 10 is enhanced.

In particular, when a filler is disposed in at upper or lower portion of a sealant, the ratio of the height $d_{filler}$ of the filler to the height $t_{frit}$ of the sealant should be reduced. In other words, as the filler is disposed closer to the center of the sealant, the impact resistance of the organic light-emitting display apparatus is enhanced.

The cylindrical filler 411*a* has rounded corners, and thus, has a smaller stress concentration ratio than the rectangular filler 411*b*, in all positions in sealant 410. That is, when the filler 411*a* is disposed at the center of a sealant and in the upper and lower portions of the sealant, stress concentration is reduced. That is, when the filler is cylindrical, the impact resistance of the organic light-emitting display apparatus is improved.

As described above, by properly setting the ratio of the height $d_{filler}$ of a filler to the height $t_{frit}$ of a sealant, the location of the filler in the sealant, and the shape of the filler, the impact resistance of an organic light-emitting display apparatus may be substantially enhanced.

Figure 6:
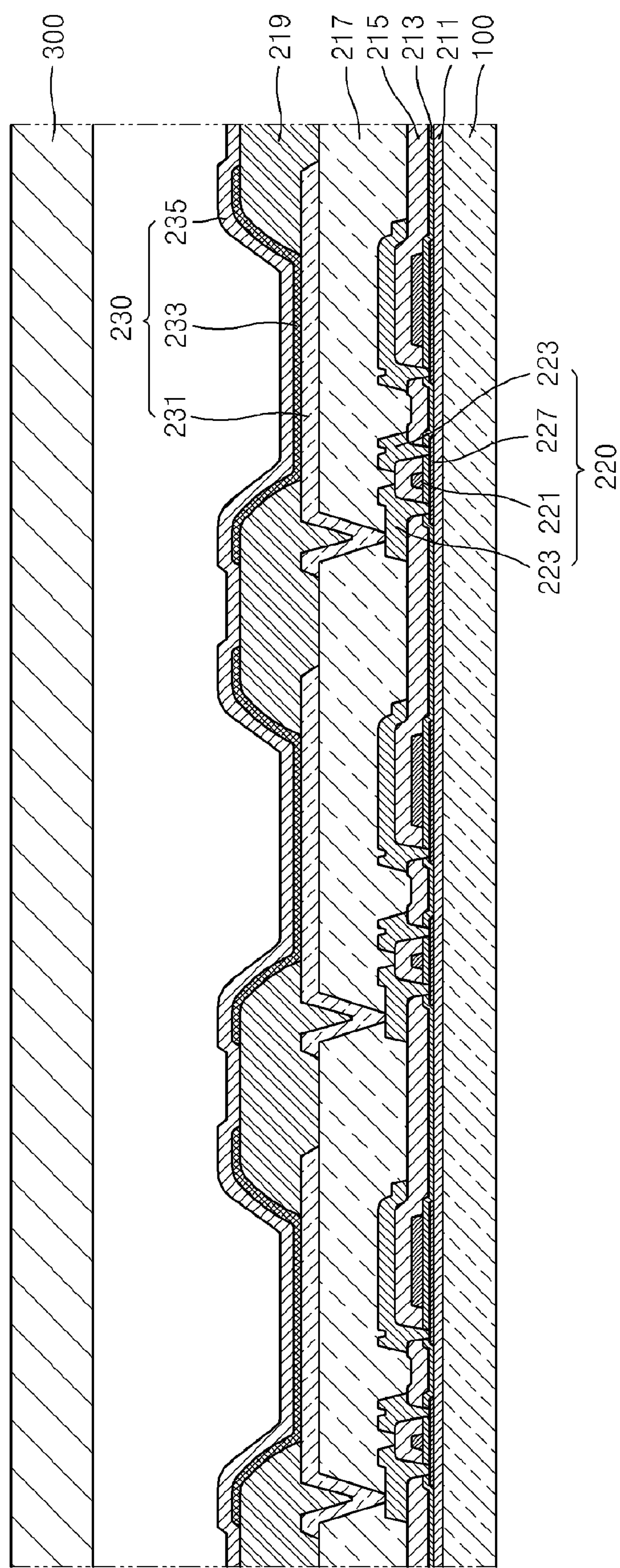
FIG. 6 is a partial, schematic cross-sectional view of the organic light-emitting display apparatus of FIG. 2.

FIG. 6 is a partial, schematic cross-sectional view of the organic light-emitting display apparatus 10 FIG. 2, exemplarily illustrating a detailed structure of the display unit 200. Referring to FIG. 6, a plurality of thin film transistors (TFTs) 220 are formed on the substrate 100. An organic light-emitting device 230 is formed on each of the TFTs 220. The organic light-emitting device 230 may include pixel electrodes 231 electrically connected to each TFT 220, an opposite electrode 235 disposed above the substrate 100, and intermediate layers 233 interposed between the pixel electrodes 231 and the opposite electrode 235. The intermediate layers 233 include an emission layer.

Each TFT 220 may include a gate electrode 221, source electrode and drain electrodes 223, a semiconductor layer 227, a gate insulating layer 213, and an inter-insulating layer 215. The structure of the TFTs 220 is not limited to the structure illustrated in FIG. 4. For example, each TFT 220 may also be an organic TFT including the semiconductor layer 227 formed of an organic material, or a silicon TFT including the semiconductor layer 227 formed of silicon. Optionally, a buffer layer 211 formed of silicon oxide or silicon nitride may be formed between the TFT 220 and the substrate 100.

The pixel electrode 231 and the opposite electrode 235 face each other. The intermediate layers 233 are interposed between the pixel electrode 231 and the opposite electrode 235 and include an organic material layer. The intermediate layers 233 may include an emission layer. The intermediate layer 233 may include a plurality of layers, which will be described later.

The pixel electrode 231 may operate as an anode, and the opposite electrode 235 may operate as a cathode. In another exemplary embodiment, the pixel electrode 231 operates as a cathode, and the opposite electrode 235 operates as an anode.

The pixel electrode 231 may be a transparent electrode or a reflective electrode. If the pixel electrode 231 is a transparent electrode, the pixel electrode 231 may be formed of ITO, IZO, ZnO, or $In_2O_3$. If the pixel electrode 231 is a reflective electrode, the pixel electrode 231 may include a reflective film formed of Ag, Mg, Al, Pt, Pd, Au, Ni, Nd, Ir, Cr, or a mixture thereof, and a film formed of ITO, IZO, ZnO, or $In_2O_3$.

The opposite electrode 235 may be a transparent electrode or a reflective electrode. If the opposite electrode 235 is a transparent electrode, the opposite electrode 235 may include a film formed of Li, Ca, LiF/Ca, LiF/AI, Al, Mg, or a mixture thereof. The opposite electrode 235 is disposed facing the pixel electrode 231 and the intermediate layer 233. The opposite electrode 235 may include an auxiliary electrode or bus electrode line formed on the film. The auxiliary electrode or bus electrode line may be formed of a transparent electrode material, such as ITO, IZO, ZnO, or $In_2O_3$. If the opposite electrode 235 is a reflective electrode, the opposite electrode 235 may be formed of Li, Ca, LiF/Ca, LiF/Al, Al, Mg, or a mixture thereof.

A pixel-defining layer (PDL) 219 covers edges of each pixel electrode 231 and has a given height outside the pixel electrode 231. The PDL 219 defines an emission region, and widens a distance between the pixel electrode 231 and the opposite electrode 235, in a direction toward the edges of the pixel electrode 231, so as to prevent the formation of a strong electric field at the edges of the pixel electrode 231. The PDL 219 thereby prevents short-circuits between the pixel electrodes 231 and the opposite electrode 235.

The intermediate layer 233 is formed between the pixel electrode 231 and the opposite electrode 235. The structure of the intermediate layer 233 may vary. The intermediate layer 233 may be formed of a low molecular weight organic material or a polymer organic material.

When the intermediate layer 233 is formed of a low molecular weight organic material, the intermediate layer 233 may include an organic emission layer (EML) and at least one layer selected from the group consisting of a hole injection layer (HIL), a hole transport layer (HTL), an emission layer, an electron transport layer (ETL), and an electron injection layer (EIL). Each of the layers may be a single layer or multi-layered. In this regard, an available low molecular weight organic material may be copper phthalocyanine (CuPc), N,N'-Di naphthalene-1-yl-N,N'-diphenyl-benzidine (NPB), or tris-8-hydroxyquinoline aluminum (Alq3). These low molecular weight organic materials may be applied in, for example, a deposition process using masks.

When the intermediate layer 233 is formed of a polymer organic material, the intermediate layer 233 may generally have an HTL and an EML. The HTL may be formed of PEDOT and the EML may be formed of a polymer material selected from poly-phenylenevinylenes (PPV) and polyfluorenes.

The organic light-emitting device 230 may be electrically connected to the TFTs 220. In this regard, if a planarization layer 217 covering the TFTs 220 is included, the organic light-emitting device 230 may be disposed on the planarization layer 217, and the pixel electrode 231 of the organic light-emitting device 230 may be electrically connected to the TFT 220, through contact holes formed in the planarization layer 217.

The organic light-emitting device 230 is sealed between the encapsulation substrate 300, the substrate 100 and the sealant 410. As described above, the encapsulation substrate 300 may be formed of glass, a plastic material, etc.

An organic light-emitting display apparatuses, according to exemplary embodiments of the present invention, are resistant to the permeation of external impurities such as oxygen and/or water vapor and have enhanced impact resistance.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light-emitting display apparatus comprising:

a substrate;

a display unit disposed on the substrate;

an encapsulation substrate disposed facing the display unit;

a sealant disposed between the substrate and the encapsulation substrate; and a sole rectangular shaped filler disposed in the sealant, wherein the height $t_{frit}$ of the sealant is greater than the height $d_{filler}$ of the filler, and the heights $t_{frit}$ and $d_{filler}$ extend in a direction perpendicular to the plane of the substrate.

2. The organic light-emitting display apparatus of claim 1, wherein a ratio of the height $d_{filler}$ of the filler to the height $t_{frit}$ of the sealant is 0.75 or less.

3. The organic light-emitting display apparatus of claim 2, wherein the ratio of the height $t_{frit}$ of the sealant to the height $d_{filler}$ of the filler is 0.5 or less.

4. The organic light-emitting display apparatus of claim 1, wherein the sealant comprises a glass frit.

5. The organic light-emitting display apparatus of claim 1, wherein the filler is disposed at the center of the sealant, equidistant from the substrate and the encapsulation substrate.

6. The organic light-emitting display apparatus of claim 1, wherein the filler is cylindrical.

7. The organic light-emitting display apparatus of claim 1, wherein the sealant is disposed around the display unit.

8. The organic light-emitting display apparatus of claim 1, wherein the filler is generally rectangular.

9. The organic light-emitting display apparatus of claim 8, wherein corners of the filler are rounded.

10. The organic light-emitting display apparatus of claim 1, wherein the filler comprises a ceramic material.

11. The organic light-emitting display apparatus of claim 1, wherein the filler has a lower coefficient of thermal expansion (CTE) than the sealant.

12. The organic light-emitting display apparatus of claim 1, wherein the filler is disposed directly on the substrate or directly on the encapsulation substrate.

* * * * *